United States Patent
Yamada et al.

(10) Patent No.: US 8,115,317 B2
(45) Date of Patent: Feb. 14, 2012

(54) SEMICONDUCTOR DEVICE INCLUDING ELECTRODE STRUCTURE WITH FIRST AND SECOND OPENINGS AND MANUFACTURING METHOD THEREOF

(75) Inventors: Shigeru Yamada, Tokyo (JP); Yutaka Kadogawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 98 days.

(21) Appl. No.: 12/474,400

(22) Filed: May 29, 2009

(65) Prior Publication Data

US 2009/0294987 A1 Dec. 3, 2009

(30) Foreign Application Priority Data

Jun. 3, 2008 (JP) ................................. 2008-145815

(51) Int. Cl.
*H01L 23/48* (2006.01)
*H01L 23/52* (2006.01)
*H01L 29/40* (2006.01)

(52) U.S. Cl. ........ 257/774; 257/621; 257/758; 257/635; 257/636; 257/637; 438/622; 438/672; 438/675; 438/667

(58) Field of Classification Search .................. 257/774, 257/621, 635, 758, 636, 637; 438/629, 630, 438/637, 638, 639, 640, 668, 672, 675, 666, 438/667, 622
See application file for complete search history.

(56) References Cited

U.S. PATENT DOCUMENTS

| 7,432,196 | B2 * | 10/2008 | Tanida et al. | 438/667 |
| 2008/0128848 | A1 * | 6/2008 | Suzuki et al. | 257/448 |
| 2008/0284041 | A1 * | 11/2008 | Jang et al. | 257/774 |

FOREIGN PATENT DOCUMENTS

JP  2007-053149  3/2007

\* cited by examiner

*Primary Examiner* — Ha Tran T Nguyen
*Assistant Examiner* — Thanh Y Tran
(74) *Attorney, Agent, or Firm* — Volentine & Whitt, PLLC

(57) ABSTRACT

To improve connection reliability of a through electrode in a semiconductor device, and prevent deterioration of electrical characteristics due to a residue generated from a pad at the time of forming the through electrode. A contact area between a pad and a conductor layer is equal to a diameter of a hole of an opening provided in a silicon substrate. Consequently, it is possible to increase the contact area as compared with a conventional configuration. This improves the connection reliability. Furthermore, a residue containing metal is attached to the outside of an insulation film in the manufacturing process. Consequently, the residue is prevented from contacting a silicon substrate body. Also, heavy metals, such as Cu, in the residue are prevented from being diffused into the silicon substrate body. Therefore, it is possible to prevent the deterioration of electrical characteristics.

11 Claims, 6 Drawing Sheets

SEMICONDUCTOR DEVICE INCLUDING ELECTRODE STRUCTURE WITH FIRST AND SECOND OPENINGS AND MANUFACTURING METHOD THEREOF

BACKGROUND OF THE INVENTION

1. Field of the Invention

The present invention relates to a semiconductor device including a through electrode and a manufacturing method thereof.

2. Description of the Related Art

In the past, a semiconductor device, such as a chip size package (CSP) semiconductor device or a system-in-package (SiP) semiconductor device, using a through electrode to achieve high integration and miniaturization of the semiconductor device was proposed. The following document discloses an example of a multi-layer package wherein a plurality of semiconductor chips having semiconductor circuits loaded thereon are mounted at high density, an SiP technology is used to configure a high-performance system within a short period of time, and the semiconductor chips are stacked three-dimensionally, thereby accomplishing dramatic downsizing of the semiconductor device.

Patent document 1: Japanese Patent Application Kokai (Laid-Open) No. 2007-53149

Patent document 1 discloses a method of achieving electric connection between the stacked semiconductor chips including forming a through electrode in a semiconductor substrate, which is a base member of each semiconductor chip, forming an electrode pad on the face opposite to a face where an integrated circuit is formed, and connecting the electrode pads of the respective semiconductor chips via the through electrode.

In particular, as shown in FIGS. 4 to 6 of Patent document 1, an interlayer insulation film and an element face electrode are formed on the semiconductor substrate, a mortar-shaped or funnel-shaped hole for the through electrode is formed in the semiconductor substrate until the hole reaches the interlayer insulation film from the side opposite to the element face, an insulation film is formed in the mortar-shaped hole, and a smaller hole is formed in the insulation film to expose the surface of the element face electrode. A film-shaped contact electrode is provided on the wall of the mortar-shaped hole, and the contact electrode is electrically connected to the element face electrode via the smaller hole. A bump is press-fit in the mortar-shaped hole via the contact electrode, and the stacked semiconductor chips are electrically connected to one another via the bump. Since the bump is inserted into the mortar-shaped hole, this configuration has an advantage that the bump can be mounted easily and accurately.

In the conventional technology disclosed in Patent document 1, however, if a semiconductor chip having a through electrode is used without a press-fit bump, the contact electrode and the element face electrode are electrically connected to each other via the small hole without the pressure-contact force from the bump. As a result, the contact area between the contact electrode and the element face electrode is decreased, and therefore, connection reliability is deteriorated. For this reason, the use of the disclosed technology Is limited to a structure in which the contact electrode and the element face electrode are brought into contact with each other under the pressure from the bump. This is disadvantageous and inconvenient.

SUMMARY OF THE INVENTION

A semiconductor device in accordance with the present invention is characterized by including a semiconductor substrate having a first face and a second face opposite to the first face, a semiconductor element formed on the first face side, an electrode formed on the first face side, the electrode being electrically connected to the semiconductor element, a first insulation film that covers the semiconductor element and the electrode, a first opening having a first diameter, the first opening having a depth sufficient to reach the first insulation film (or a depth sufficient to reach an interior of the first insulation film) from the second face through the semiconductor substrate, a second insulation film coated on an inner side face of the first opening and the second face, a second opening having a second diameter and defined by an inner side face of the second insulation film coated on the inner side face of the first opening, the second opening passing through the first insulation film to expose the electrode, and a conductor layer formed on the second insulation film and an inner side face and inner bottom of the second opening, the conductor layer being electrically connected to the electrode.

A manufacturing method for a semiconductor device according to the present invention is a semiconductor device manufacturing method that uses a semiconductor substrate having a first face and a second face opposite to the first face, with a semiconductor element and an electrode electrically connected to the semiconductor element being covered with a first insulation film and being provided on the first face side, the manufacturing method including the step of selectively forming a first opening having a first diameter, the first opening having a depth sufficient to reach the first insulation film (or a depth sufficient to reach an interior of the first insulation film) from the second face through the semiconductor substrate, the step of forming a second insulation film on an inner side face and inner bottom of the first opening and the second face, the step of selectively forming a second opening having a second diameter surrounded by an inner side face of the second insulation film formed on the inner side face of the first opening, the second opening having a depth sufficient to reach the electrode from the second insulation film formed on the inner bottom of the first opening through the first insulation film, and the step of selectively forming a conductor layer on the second insulation film and an inner side face and inner bottom of the second opening and connecting the conductor layer to the electrode.

According to another aspect of the present invention, the interface between the first insulation film and the second insulation film is configured in the shape of a step extending in the transverse direction and in the height direction. A conventional configuration has a possibility that the conductor layer and the semiconductor substrate main body are electrically conducted to each other by the interface between the first insulation film and the second insulation film because the interface becomes a path. In the present invention, on the other hand, the interface between the first insulation film and the second insulation film is configured in the shape of a step, and the distance is also increased. As a result, a path is difficult to be created in this structure. Consequently, it is possible to reduce a possibility of the conductor layer and the semiconductor substrate main body being electrically conducted to each other. This improves reliability.

According to another aspect of the present invention, the interface between the first insulation film and the second insulation film is configured in the shape of a step extending in the transverse direction and in the height direction. A conventional configuration has a possibility that the conductor layer and the semiconductor substrate main body are electrically conducted to each other by the interface between the first insulation film and the second insulation film because the interface becomes a path. In the present invention, on the other hand, the interface between the first insulation film and the second insulation film is configured in the shape of a step, and the distance is also increased. As a result, a path is difficult to be crated in this structure. Consequently, it is possible to reduce a possibility of the conductor layer and the semiconductor substrate main body being electrically conducted to each other. This improves reliability.

A best mode for carrying out the invention will become apparent when the following description of preferred embodiments is read with reference to the accompanying drawings. It should be noted that the drawings are provided only for the purpose of explanation, but not for the purpose of limiting the scope of the present invention.

BRIEF DESCRIPTION OF THE DRAWINGS

FIGS. 2-1(1) to 2-1(3) are views illustrating a schematic manufacturing process example of the semiconductor device shown in FIG. 1(b);

FIGS. 2-2(4) and 2-2(6) are views illustrating a schematic manufacturing process example of the semiconductor device shown in FIG. 1(b);

FIGS. 4-1(1) to 4-1(4) are views illustrating a schematic manufacturing process example of the semiconductor device shown in FIG. 3; and FIGS. 4-2(5) to 4-2(7) are views illustrating a schematic manufacturing process example of the semiconductor device shown in FIG. 3.

DETAILED DESCRIPTION OF THE INVENTION

First Embodiment

Construction of First Embodiment

Figure 1A:
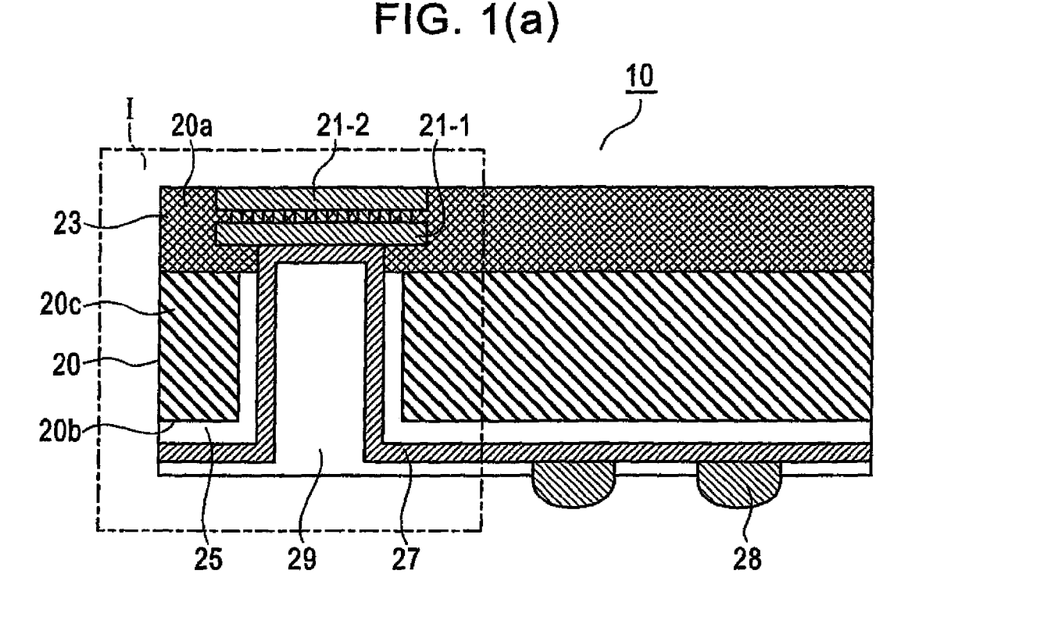
FIGS. 1(a) and 1(b) are schematic cross-sectional views illustrating a semiconductor device including a through electrode according to a first embodiment of the present invention.
Figure 1B:
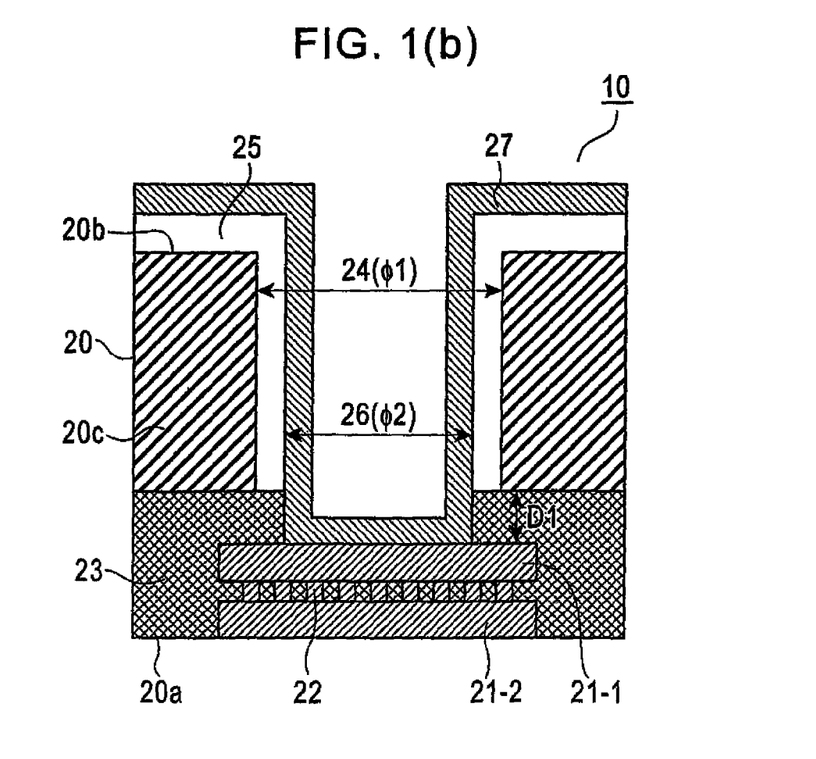

FIGS. 1(a) and 1(b) are schematic cross-sectional views illustrating a semiconductor device including a through electrode according to a first embodiment of the present invention. FIG. 1(a) is an entire cross-sectional view, and FIG. 1(b) is an enlarged cross-sectional view illustrating part I of FIG. 1(a) in a vertically reverse manner.

A semiconductor device 10 having a through electrode according to the first embodiment of the present invention, which may be a chip size package (CSP) or system-in-package (SiP) semiconductor device, includes a semiconductor substrate (for example, a silicon substrate) 20 having a thickness of approximately 50 to 200 µm. The silicon substrate 20 has a first face (for example, a circuit forming face) 20a and a second face (for example, an opposite, no-circuit forming face) 20b, which are opposite to each other. A semiconductor element (not shown) constructed to have a multi-layer wiring structure (for example, a two-layer wiring structure) and electrodes 21-1 and 21-2 (for example, pads made of aluminum (Al)) connected to the semiconductor element by a wire pattern (not shown) are formed on the circuit forming face 20a side. The pads 21-1 and 21-2, which are located at different layers, are connected to each other by via holes 22. The semiconductor element (not shown) and the pads 21-1 and 21-2 are covered by a first insulation film (for example, a silicon oxide film which is a middle insulation film) 23. A distance D1 between the pad 21-1 and a silicon substrate main body 20c is approximately 0.5 to 1 µm.

In the silicon substrate 20 is formed a first opening 24 having a depth sufficient to reach the silicon oxide film 23 from the no-circuit forming face 20b through the silicon substrate body 20c. The first opening 24 has a first diameter φ1 of, for example, approximately 50 µm. The inner side face of the first opening 24 and the no-circuit forming face 20b are coated with a second insulation film 25 which is composed of a silicon oxide film having a film thickness of approximately 1 µm. A second opening 26 defined (surrounded) by the inner side of the second insulation film 25 coated on the inner side face of the first opening 24 has a second diameter φ2 of, for example, approximately 48 µm. The second opening 26 extends through the silicon oxide film 23 such that the bottom of the second opening exposes a particular surface of the pad 21-1. A conductor layer 27 made of Cu having a film thickness of approximately 5 to 10 µm is formed on the insulation film 25 and the inner side face and inner bottom of the opening 26. The conductor layer 27 is electrically connected to the pad 21-1.

As shown in the overall view of FIG. 1(a), for example, a plurality of bumps 28 are connected to the conductor layer 27. The entire face of the no-circuit forming face 20b including the conductor layer 27, excluding the bumps 28, are covered by an insulation protective film 29. Although not shown, a plurality of pad groups 21-1, 21-2, . . . are arranged along the circuit forming face 20a in the transverse direction on the circuit forming face 20a side.

Manufacturing Method of First Embodiment

FIGS. 2-1(1) to 2-1(3) and FIGS. 2-2(4) to 2-2(6) are views schematically illustrating an example of a process of manufacturing the semiconductor device 10 shown in FIG. 1(b).

The semiconductor device 10 including the through electrode is manufactured as follows. In the step of FIG. 2-1(1), a silicon substrate 20, having a thickness of approximately 50 to 200 µm, in which one or more semiconductor elements and associated parts have been provided, is prepared. An semiconductor element (not shown) constructed to have a multi-layer wiring structure (for example, a two-layer wiring structure) and pads 21-1 and 21-2 made of Al connected to the semiconductor element by a wire pattern (not shown) are formed on a circuit forming face 20a side of the silicon substrate 20. The semiconductor element (not shown) and the pads 21-1 and 21-2 are covered with a silicon oxide film 23.

In the step of FIG. 2-1(2), a resist is applied to an no-circuit forming face 20b of the silicon substrate 20, and the no-circuit forming face 20b is exposed and developed, using a photolithography technology, to form a resist pattern 30 having a hole of a diameter φ1 (for example, approximately 50 µm). In the step of FIG. 2-1(2), the silicon substrate 20 is etched by an etching technology using the resist pattern 30 as a mask to form an opening 24 having a depth sufficient to reach the silicon oxide film 23 from the no-circuit forming face 20b through a silicon substrate main body 20c. Subsequently, the resist pattern 30, which is now unnecessary, is removed by a stripping liquid.

In the step of FIG. 2-2(4), an insulation film 25 having a film thickness of approximately 1 µm is formed over the entirety of the no-circuit forming face 20b side by a chemical vapor deposition (hereinafter, referred to as CVD) method. The insulation film 25 extends over the no-circuit forming face 20b and the inner side face and inner bottom of the opening 24. A hole defined (surrounded) by the inner side face of the insulation film 25 formed on the inner side of the opening 24 has a diameter φ2 of, for example, approximately 48 μm. In the step of FIG. 2-2(5), that portion of the insulation film 25 which exists at the inner bottom of the opening 24 is etched and removed by a dry etching technology to form an opening 26 having a depth sufficient to reach the aluminum pad 21-1 through the silicon oxide film 23. Since the pad 21-1 made of Al contains heavy metals such as copper (Cu), and a residue 21a containing the etched metal (the pad 21-1 made of Al) is attached to the inner side face of the insulation film 25, the residue 21a is removed by a washing process using a washing liquid such as an organic solvent.

In the step of FIG. 2-2(6), an under-bump metallization (hereinafter, referred to as UBM) film (not shown) made of titanium (Ti)/copper (Cu) is coated over the entirety of the no-circuit forming face 20b by a deposition method or a sputtering method, and the UBM film is selectively etched by a photolithography technology. Subsequently, a conductor layer 27 is selectively formed on the UBM film by a plating method to form a wire pattern having a film thickness of approximately 5 to 10 μm. As a result, the conductor layer 27 including the UBM film is selectively formed on the insulation film 25 and the inner side face and inner bottom of the opening 26. The conductor layer 27 is electrically connected to the pad 21-1. Subsequently, as shown In FIG. 1(a), bumps 28 are formed on the no-circuit forming face 20b side, and the opening 26 are covered by a protective film 29. In this way, a semiconductor device 10 including a through electrode is completed.

Advantages of First Embodiment

According to the first embodiment, the contact area between the pad 21-1 and the conductor layer 27 including the UBM film is equal to the diameter φ2 of the hole of the opening 26 provided in the silicon substrate 20. Consequently, it is possible to increase the contact area as compared with the technology disclosed in Patent document 1. This improves connection reliability. Furthermore, the residue 21a containing metal is caused to adhere to the outside of the insulation film 25 in the manufacturing process. Consequently, the residue 21a is prevented from contacting the silicon substrate main body 20c. This prevents heavy metals, such as Cu, in the residue 21a from being diffused into the silicon substrate main body 20c, and therefore, it is possible to prevent the deterioration of electrical characteristics.

Second Embodiment

Construction of Second Embodiment

Figure 3:
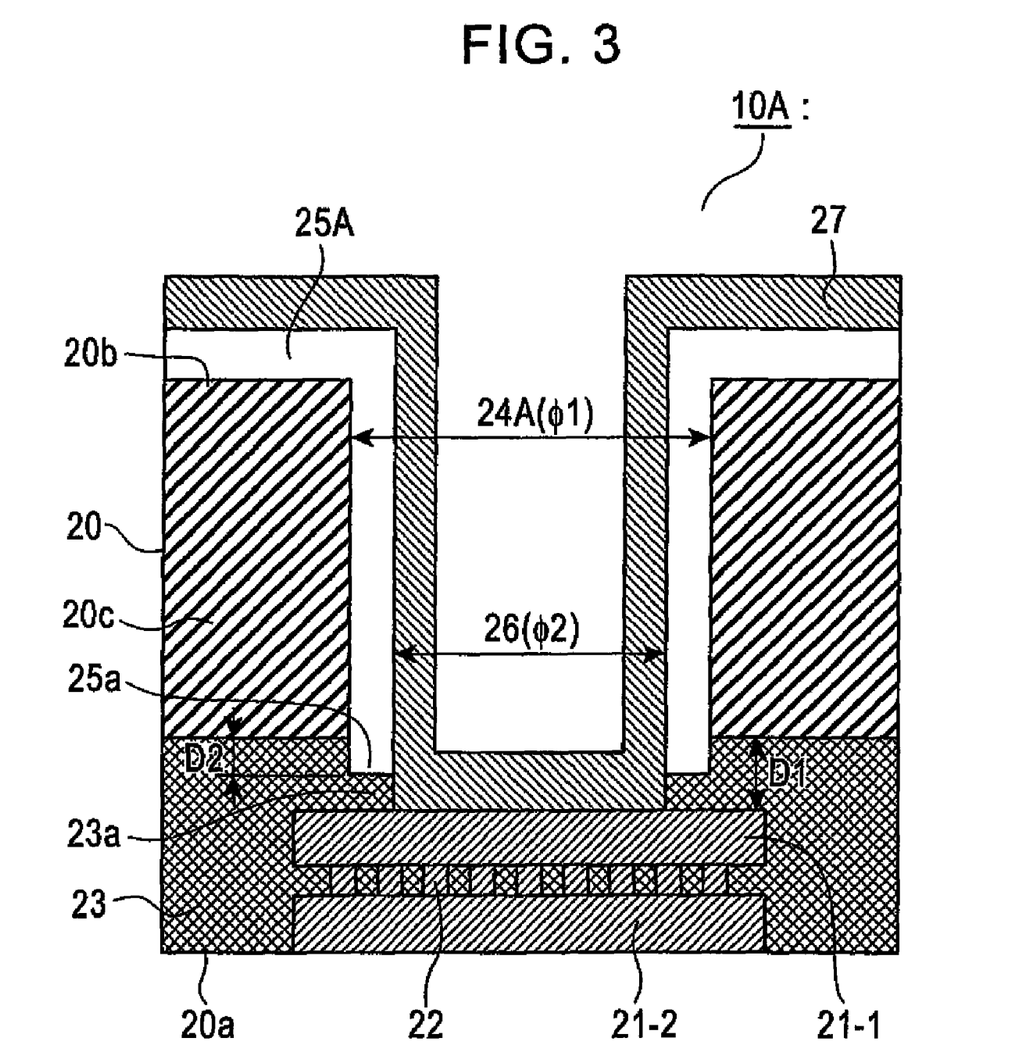
FIG. 3 is a schematic enlarged cross-sectional view illustrating a semiconductor device including a through electrode according to a second embodiment of the present invention.
Figure 21:
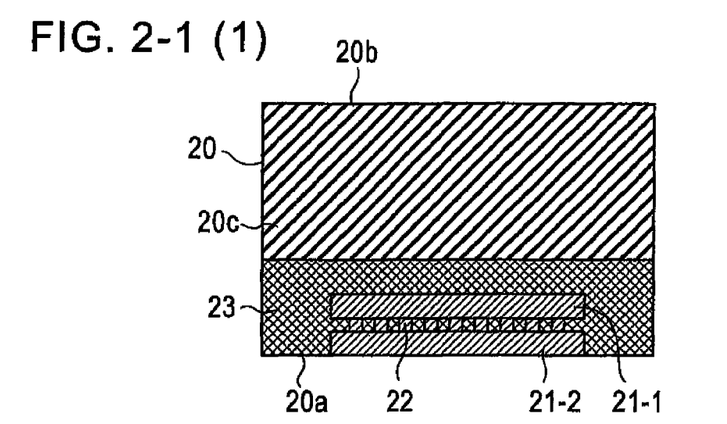
Figure 22:
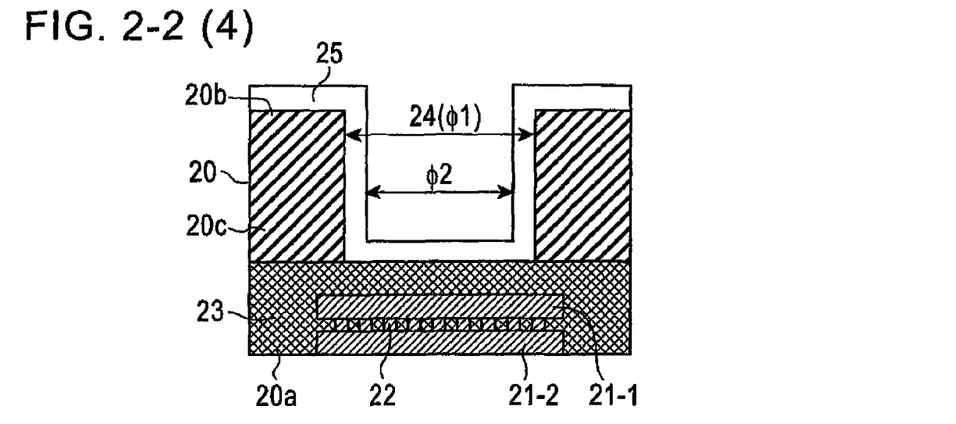
Figure 41:
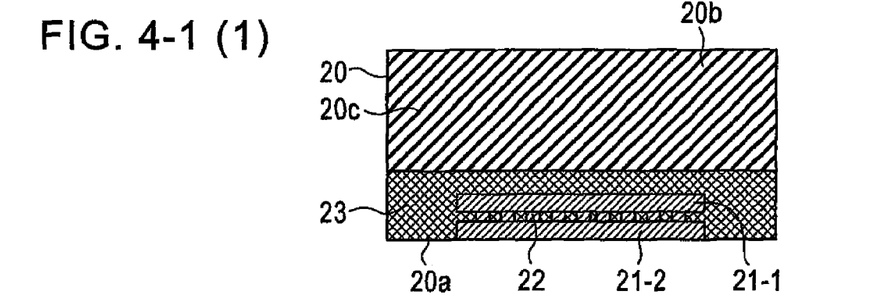
Figure 42:
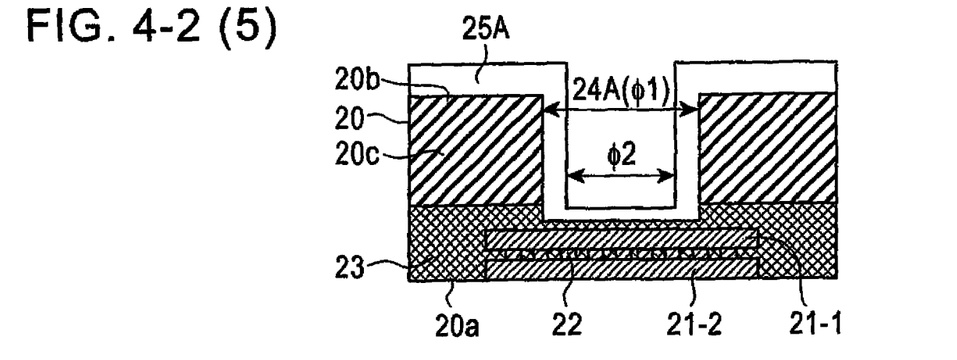

FIG. 3 is an enlarged cross-sectional view schematically illustrating a semiconductor device including a through electrode according to a second embodiment of the present invention. Components of the second embodiment common to those shown in FIG. 1(b) illustrating the first embodiment are denoted by common reference numerals and symbols.

In a semiconductor device 10A including a through electrode according to the second embodiment, a first opening 24A and an insulation film 25A, which are different in cross-sectional structure from the first opening 24 and the insulation film 25 of the first embodiment, are provided instead of the first opening 24 and the insulation film 25 of the first embodiment.

The first opening 24A is formed to have a depth sufficient to reach the interior of a silicon oxide film 23 from an no-circuit forming face 20b of a silicon substrate 20 through a silicon substrate main body 20c. The first opening 24A has a diameter φ1, for example, approximately 50 μm. That is, the first opening 24A of the second embodiment is different from the first opening 24A of the first embodiment in that the bottom of the first opening 24A is present inside the silicon oxide film 23. Correspondingly, the insulation film 25A of the second embodiment is composed of a silicon oxide film having a film thickness of approximately 1 μm, and is coated on the no-circuit forming face 02b of the silicon substrate 20 and the inner side face of the first opening 24A.

Unlike the first embodiment, a lower end 25a of the insulation film 25A extends to the interior of the silicon oxide film 23. An extending distance D2 of the lower end 25a is approximately 30 to 90% of the distance D1 (for example, approximately 0.5 to 1 μm) between a pad 21-1 and the silicon substrate main body 20c. A step 23a is formed in the silicon oxide film 23 at a place where the lower end 25a of the insulation film 25A is received. In other words, the interface between the silicon oxide film 23 and the lower end 25a of the insulation film 25A (that is, the place where the step 23a of the silicon oxide film 23 is located) is configured in the shape of a step in the transverse direction parallel to the circuit forming face 20a and the no-circuit forming face 20b of the silicon substrate 20 and in the height direction perpendicular to the circuit forming face 20a and the no-circuit forming face 20b of the silicon substrate 20. The remaining construction is the same as the first embodiment.

Manufacturing Method of Second Embodiment

FIGS. 4-1(1) to 4-1(4) and FIGS. 4-2(5) to 4-2(7) are views illustrating a schematic manufacturing process example of the semiconductor device 10A shown in FIG. 3. Components of the second embodiment common to those shown in FIGS. 2-1(1) to 2-1(3) and FIGS. 2-2(4) to 2-2(6) illustrating the manufacturing process of the first embodiment are denoted by common reference numerals and symbols.

The semiconductor device 10A including the through electrode according to the second embodiment is manufactured as follows. In the step of FIG. 4-1(1), a silicon substrate 20, having a thickness of approximately 50 to 200 μm, in which one or more semiconductor elements are formed, is prepared, in the same manner as the step of FIG. 2-1(1) of the first embodiment. In the step of 4-1(2), a resist pattern 30 having a hole of a diameter φ1 (for example, approximately 50 μm) is formed on an no-circuit forming face 20b of the silicon substrate 20, in the same manner as the step of FIG. 2-1(2) of the first embodiment. In the step of FIG. 4-1(3), the silicon substrate 20 is etched by an etching technology using the resist pattern 30 as a mask to form an opening having a depth sufficient to reach a silicon oxide film 23 from the no-circuit forming face 20b through a silicon substrate main body 20c, in the same manner as the step of FIG. 2-1(3) of the first embodiment.

Subsequently, in the step of FIG. 4-1(4), part of the silicon oxide film 23 in the opening is etched by an etching technology using the resist pattern 30 as a mask to form an opening 24A having a depth sufficient to reach the interior of the silicon oxide film 23 from the no-circuit forming face 20b through the silicon substrate main body 20c, in a different manner from the first embodiment. Preferably a depth (=distance D2) to which part of the silicon oxide film 23 is removed by etching is approximately 30 to 90% of a distance D1 (for example, approximately 0.5 to 1 μm) between a pad 21-1 and the silicon substrate main body 20c. Subsequently, the resist pattern 30, which is now unnecessary, is removed by a stripping liquid.

In the step of FIG. 4-2(5), an insulation film 25A having a film thickness of approximately 1 μm is formed over the entirety of the no-circuit forming face 20b side by a CVD method, in almost the same manner as the step of FIG. 2-2(4) of the first embodiment. Unlike the first embodiment, the insulation film 25A is formed on the no-circuit forming face 20b and the inner side face and inner bottom of the opening 24A. Unlike the first embodiment, a lower end 25a of the insulation film 25A formed on the inner side face of the opening 24A and the insulation film 25A formed on the inner bottom of the opening 24A are located at the interior of the silicon oxide film 23. A hole surrounded by the inner side face of the insulation film 25A formed on the inner side face of the opening 24A has a diameter φ2 of, for example, approximately 48 μm, which is equal to that of the first embodiment.

In the step of FIG. 4-2(6), a portion of the insulation film 25A formed at the inner bottom of the opening 24A is etched and removed by a dry etching technology to form an opening 26 having a depth sufficient to reach the pad 21-1, which is made of Al, through the silicon oxide film 23, in the same manner as the step of FIG. 2-2(5) of the first embodiment. As a result, a step 23a is formed at a portion of the silicon oxide film 23 that meets the lower end 25a of the insulation film 25A, unlike the first embodiment. Since the pad 21-1 made of Al contains heavy metals such as copper (Cu), and a residue 21a containing the etched metal (the pad 21-1 made of Al) is attached to the inner side face of the insulation film 25A, the residue 21a is removed by a washing process using a washing liquid such as an organic solvent at the time of etching, in the same manner as the first embodiment.

In the step of FIG. 4-2(7), a UBM film (not shown) is coated over the entirety of the no-circuit forming face 20b, and the UBM film is selectively etched by a photolithography technology, in the same manner as the step of FIG. 2-2(6) of the first embodiment. Subsequently, a conductor layer 27 is selectively formed on the UBM film by a plating method to form a wire pattern having a film thickness of approximately 5 to 10 μm. As a result, the conductor layer 27 including the UBM film is selectively formed on the insulation film 25A and the inner side face and inner bottom of the opening 26. Thus, the conductor layer 27 is electrically connected to the pad 21-1. Then, bumps are formed on the no-circuit forming face 20b side, and the opening 26 are covered with a protective film, in the same manner as the first embodiment. In this way, a semiconductor device 10A including a through electrode is completed.

Advantages of Second Embodiment

The second embodiment has the following advantages (i) and (ii).

(i) The contact area between the pad 21-1 and the conductor layer 27 including the UBM film is equal to the diameter φ2 of the hole of the opening 26 provided in the silicon substrate 20, in almost the same manner as the first embodiment. Consequently, it is possible to increase the contact area as compared with the technology disclosed in Patent document 1, thereby improving connection reliability. Furthermore, the residue 21a containing metal is attached to the outside of the insulation film 25A in the manufacturing process. Consequently, the residue 21a is prevented from contacting the silicon substrate main body 20c. Thus, heavy metals, such as Cu, in the residue 21a are prevented from being diffused into the silicon substrate main body 20c, and therefore, it is possible to prevent the deterioration of electrical characteristics.

(ii) The distance from the pad 21-1 and the conductor layer 27 is also increased when viewed from the silicon substrate main body 20c. This improves reliability. That is, in the second embodiment, the interface between the lower end 25a of the insulation film 25A and the step 23a of the silicon oxide film 23 is configured in the shape of a footstep in the transverse direction and in the height direction. In the technology of Patent document 1, there is a possibility that the conductor layer and the silicon substrate body may be electrically conducted to each other by the interface between the silicon oxide film and the insulation film because the interface becomes the path. In the second embodiment, on the other hand, the interface between the silicon oxide film 23 and the lower end 25a of the insulation film 25A is configured in the shape of a step, and the distance is also increased. As a result, the path is difficult to be created in this structure. Consequently, it is possible to reduce a possibility that the conductor layer 27 and the silicon substrate main body 20c may be electrically conducted to each other. This improves reliability.

Modifications

The present invention is not limited to the described-above embodiments. For example, other or modified shapes and structures can be employed for the semiconductor device, which are different from those shown in the illustrated embodiments, and/or other or modified construction materials and manufacturing conditions can be employed for the semiconductor device, which are different from those shown in the illustrated embodiments.

Industrial Applicability

The present invention is applicable to a CSP package for an image sensor (e.g., a complementary metal-oxide semiconductor (CMOS) transistor and a charge coupled device (CCD)), and a sensor using a through electrode (e.g., a light sensor and an ultraviolet (UV) sensor). The present invention is also applicable to an SiP package (e.g., a stacked memory) and a silicon interposer (Si-IP) with a through electrode.

SYMBOLS 10, 10A Semiconductor Device
20 Silicon Substrate
20a Circuit Formation Face
20b Opposite No-Circuit-Formation Face
20c Silicon Substrate Main Body
21-1, 21-2 Pad
23 Silicon Oxide Film
24, 24A, 26 Opening
25, 25A Insulation Film
27 Conductive Layer This application is based on Japanese Patent Application No. 2008-145815, filed on Jun. 3, 2008, and the entire disclosure thereof is incorporated herein by reference.

What is claimed is:
1. A semiconductor device comprising:
a semiconductor substrate having a first face and a second face opposite to the first face;
a semiconductor element formed on the first face side;
at least one electrode formed on the first face side, the at least one electrode being electrically connected to the semiconductor element;
a first insulation film that covers the semiconductor element and the at least one electrode;
a first opening having a first diameter, the first opening having a first depth from the second face of the semiconductor substrate sufficient to reach the first insulation film;
a second insulation film coated on an inner side face of the first opening and the second face;

a second opening having a second diameter and being defined by an inner side face of the second insulation film coated on the inner side face of the first opening, the second opening having second depth from the second face of the semiconductor substrate and passing through the first insulation film to expose the at least one electrode, wherein the second depth is greater than the first depth; and a conductor layer formed on the second insulation film, and on an inner side face and an inner bottom of the second opening, the conductor layer being electrically connected to the at least one electrode.

2. The semiconductor device according to claim 1, wherein a contact area between the conductor layer and the at least one electrode has a diameter equal to a diameter of the second opening.

3. A manufacturing method of a semiconductor device of claim 1, the manufacturing method comprising:

forming the first opening having the first diameter, the first opening having the first depth sufficient to reach the first insulation film from the second face through the semiconductor substrate;

forming the second insulation film on the inner side face and an inner bottom of the first opening and the second face;

forming the second opening having the second diameter and defined by the inner side face of the second insulation film formed on the inner side face of the first opening, the second opening having the second depth sufficient to reach the at least one electrode from the second insulation film formed on the inner bottom of the first opening through the first insulation film; and forming the conductor layer on the second insulation film, and on the inner side face and the inner bottom of the second opening and connecting the conductor layer to the at least one electrode.

4. The manufacturing method according to claim 3, wherein the semiconductor substrate comprises a silicon substrate.

5. The manufacturing method according to claim 3, wherein the first insulation film comprises a silicon oxide film.

6. A semiconductor device comprising:

a semiconductor substrate having a first face and a second face opposite to the first face;

a semiconductor element formed on the first face side;

at least one electrode formed on the first face side, the at least one electrode being electrically connected to the semiconductor element;

a first insulation film that covers the semiconductor element and the at least one electrode;

a first opening having a first diameter, the first opening having a first depth from the second face of the semiconductor substrate sufficient to reach an interior of the first insulation film;

a second insulation film coated on an inner side face of the first opening and the second face;

a second opening having a second diameter and defined by an inner side face of the second insulation film coated on the inner side face of the first opening, the second opening having second depth from the second face of the semiconductor substrate and passing through the first insulation film to expose the at least one electrode, wherein the second depth is greater than the first depth; and a conductor layer formed on the second insulation film, and on an inner side face and an inner bottom of the second opening, the conductor layer being electrically connected to the at least one electrode.

7. The semiconductor device according to claim 6, wherein an interface between the first insulation film and the second insulation film is configured in the shape of a step extending in a transverse direction parallel to the first and second faces and in a height direction perpendicular to the first and second faces.

8. A manufacturing method of a semiconductor device of claim 6, the manufacturing method comprising:

forming the first opening having the first diameter, the first opening having the first depth sufficient to reach the interior of the first insulation film from the second face through the semiconductor substrate;

forming the second insulation film on the inner side face and an inner bottom of the first opening and the second face;

forming the second opening having the second diameter and defined by the inner side face of the second insulation film formed on the inner side face of the first opening, the second opening having the second depth sufficient to reach the at least one electrode from the second insulation film formed on the inner bottom of the first opening through the first insulation film; and forming the conductor layer on the second insulation film, and on the inner side face and the inner bottom of the second opening and connecting the conductor layer to the at least one electrode.

9. The manufacturing method according to claim 8, wherein the semiconductor substrate comprises a silicon substrate.

10. The manufacturing method according to claim 8, wherein the first insulation film comprises a silicon oxide film.

11. The semiconductor device according to claim 6, wherein a contact area between the conductor layer and the at least one electrode has a diameter equal to the second diameter of the second opening.

* * * * *